(12) United States Patent
Ishida et al.

(10) Patent No.: US 7,683,399 B2
(45) Date of Patent: Mar. 23, 2010

(54) TRANSISTOR

(75) Inventors: Hidetoshi Ishida, Osaka (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 11/758,304

(22) Filed: Jun. 5, 2007

(65) Prior Publication Data

US 2007/0278521 A1    Dec. 6, 2007

(30) Foreign Application Priority Data

Jun. 6, 2006   (JP) .............................. 2006-157776

(51) Int. Cl.
*H01L 31/0328* (2006.01)
(52) U.S. Cl. .............................. 257/192; 257/E29.246
(58) Field of Classification Search ................ 257/213, 257/276, 316, 192, 194, E29.246
See application file for complete search history.

(56) References Cited

U.S. PATENT DOCUMENTS

| | | | |
|---|---|---|---|
| 6,429,471 B1 | 8/2002 | Yokoyama et al. | |
| 7,038,252 B2 | 5/2006 | Saito et al. | |
| 2003/0162339 A1* | 8/2003 | Morizuka | 438/172 |
| 2005/0173728 A1* | 8/2005 | Saxler | 257/192 |
| 2006/0060871 A1 | 3/2006 | Beach | |
| 2006/0273347 A1* | 12/2006 | Hikita et al. | 257/192 |
| 2007/0057290 A1 | 3/2007 | Ishida et al. | |
| 2009/0121775 A1 | 5/2009 | Ueda et al. | |

FOREIGN PATENT DOCUMENTS

| | | |
|---|---|---|
| JP | 11-261053 | 9/1999 |
| JP | 2000 349096 | 12/2000 |
| JP | 2004 273486 | 9/2004 |

OTHER PUBLICATIONS

A machine translation for Foreign Patent Document #JP2000-349096 has been provided and is attached.*
English language Abstract of JP 2000-349096.
English language Abstract of JP 2004-273486.
Hikita et al., "350V/150 AlGaN/GaN power HFET on Silicon substrate with source-via grounding (SVG) structure", Technical Digest of 2004 International Electron Devices Meeting, pp. 803-806.

(Continued)

*Primary Examiner*—Mark Prenty
(74) *Attorney, Agent, or Firm*—Greenblum & Bernstein P.L.C.

(57) ABSTRACT

There is provided a normally-off type transistor made of a nitride semiconductor. The transistor includes; an undoped GaN layer which forms a channel region; an undoped $Al_{0.2}Ga_{0.8}N$ layer which is formed on the undoped GaN layer and has a band gap larger than that of the undoped GaN layer; a p-type $Al_{0.2}Ga_{0.8}N$ control layer which is formed on the undoped $Al_{0.2}Ga_{0.8}N$ layer, has a p-type conductivity and forms a control region; an Ni gate electrode which contacts with the p-type $Al_{0.2}Ga_{0.8}N$ control layer; a Ti/Al source electrode and a Ti/Al drain electrode which are formed beside the p-type $Al_{0.2}Ga_{0.8}N$ control layer; and an Ni ohmic electrode which is connected to the undoped GaN layer and serves as a hole absorbing electrode. With this transistor, it is possible to achieve a large-current operation and a high switching speed.

14 Claims, 12 Drawing Sheets

OTHER PUBLICATIONS

Ambacher et al, "Two-dimensional electron gases induced by spontaneous and piezoelectric polarization charges in N- and Ga-face AlGaN/GaN heterostructures", Journal of Applied Physics, vol. 85 (1999), pp. 3222-3233, American Institute of Physics.

Zhang et al., "Epitaxially-Grown GaN Junction Field Effect Transistors", IEEE Transactions on Electron Devices, vol. 47, No. 3, pp. 507-511 (2000).

English language Abstract of JP 11-261053, Sep. 24, 1999.

* cited by examiner

TRANSISTOR

BACKGROUND OF THE INVENTION (1) Field of the Invention

The present invention relates to a transistor made of a nitride semiconductor.

(2) Description of the Prior Art

In recent years, there has been actively made studies of field effect transistors (referred to as "FET" hereinafter) made of a GaN-based material, as high-frequency and high-power devices.

Hereinafter, a conventional transistor made of a nitride semiconductor material is described.

FIG. 1 shows a sectional view of a conventional FET having an AlGaN/GaN hetero junction. FIG. 2 shows distribution of fixed charges and free electrons induced by polarization in the conventional FET shown in FIG. 1. FIG. 3 shows an energy band diagram in the conventional FET. FIG. 4 shows a relation between a gate voltage and a drain current in the FET using two-dimensional electron gas as a carrier.

As shown in FIG. 1, the conventional FET made of a nitride semiconductor includes: a sapphire substrate 901 which has a (0001) plane as a main plane; an undoped GaN layer 902 which is formed on the sapphire substrate 901; an undoped $Al_{0.25}Ga_{0.75}N$ layer 903 which is formed on the undoped GaN layer 902; a source electrode 905 and a drain electrode 906 which are formed on the undoped $Al_{0.25}Ga_{0.75}N$ layer 903 and are made of Ti and Al; a gate electrode 907 which is formed on the undoped $Al_{0.25}Ga_{0.75}N$ layer 903 and is made of Pd; and a passivation film 904 which covers the undoped $Al_{0.25}Ga_{0.75}N$ layer 903 and is made of SiN.

In the conventional FET shown in FIG. 1, two-dimensional electron gas of about $1\times10^{13}$ cm$^{-2}$ is generated at a hetero junction interface between the undoped GaN layer 902 and the undoped $Al_{0.25}Ga_{0.75}N$ layer 903, irrespective of no implantation of impurities, due to spontaneous polarization and piezoelectric polarization inherent in materials of the undoped $Al_{0.25}Ga_{0.75}N$ layer 903.

As shown in FIG. 2, negative fixed charges are generated at a top face of the undoped $Al_{0.25}Ga_{0.75}N$ layer 903 (a face contacting with the gate electrode 907) and a top face of the undoped GaN layer 902, respectively. On the other hand, positive fixed charges are generated at a bottom face of the undoped $Al_{0.25}Ga_{0.75}N$ layer 903 (a face closer to the sapphire substrate 901) and a bottom face of the undoped GaN layer 902, respectively. Herein, an absolute value of an amount of the fixed charges generated at the surface of the undoped $Al_{0.25}Ga_{0.75}N$ layer 903 is higher than an absolute value of an amount of the fixed charges generated at the surface of the undoped GaN layer 902. Therefore, sheet carriers are generated in the form of two-dimensional electron gas at the hetero interface on the undoped GaN layer 902 side in an amount for compensating a difference between such fixed charges (Ns in FIG. 2). In FIG. 2, a solid arrow indicates the fixed charges generated at the undoped $Al_{0.25}Ga_{0.75}N$ layer 903, and a broken arrow indicates the fixed charges generated at the undoped GaN layer 902.

With this polarization, an electric field is generated in the undoped GaN layer 902 and the undoped $Al_{0.25}Ga_{0.75}N$ layer 903, and the energy band diagram is as shown in FIG. 3. In the undoped GaN layer 902, that is, a valence band in the vicinity of the hetero interface has a potential energy which is equal to or less than a Fermi level. Therefore, the conventional FET has an electric characteristic of a normally-on type as shown in FIG. 4.

The source electrode 905 and the drain electrode 906 contact with the undoped $Al_{0.25}Ga_{0.75}N$ layer 903. In the case where the undoped $Al_{0.25}Ga_{0.75}N$ layer 903 has a small thickness, for example, equal to or less than 30 nm, a channel region in which the two-dimensional electron gas is generated (herein, part of the undoped GaN layer 902) is electrically connected to the source electrode 905 and the drain electrode 906 by a tunnel current. Thus, the source electrode 905 and the drain electrode 906 serve as preferable ohmic electrodes. The gate electrode 907 made of Pd has a large work function of 5.1 eV, and achieves a preferable Schottky junction with the undoped $Al_{0.25}Ga_{0.75}N$ layer 903 (refer to M. Hikita et al., Technical Digest of 2004 International Electron Devices Meeting (2004) p. 803).

In the case where a normally-off characteristic is realized using a GaN-based semiconductor material having polarization, as described above, it is necessary to reduce carriers generated in the channel by spontaneous polarization and piezoelectric polarization inherent in crystal. As for a FET having a hetero junction between AlGaN and GaN, if an Al composition in an AlGaN layer is lowered, a stress due to a difference in lattice constant between AlGaN and GaN is also reduced; thus, piezoelectric polarization is decreased. Consequently, a sheet carrier concentration is decreased (refer to O. Ambacher et al., J. Appl. Phys. Vol. 85 (1999) p. 3222). In the undoped $Al_{0.25}Ga_{0.75}N$ layer 903, specifically, when a mixed crystal ratio of Al to Ga is lowered to 0.15 while a thickness is maintained at 30 nm, a sheet carrier concentration is considerably decreased from $1.4\times10^{13}$ cm$^{-2}$ to $5\times10^{12}$ cm$^{-2}$. This decrease in carrier concentration reduces an operating current. In addition, when the Al composition in the undoped $Al_{0.25}Ga_{0.75}N$ layer 903 is lowered, a potential barrier at a gate is lowered.

Moreover, a forward voltage applicable to the gate electrode 907 has an upper limit value to suppress generation of a leakage current at the gate electrode 907. This hinders a gate voltage from becoming high, and makes it difficult to obtain a sufficiently large drain current.

In order to solve such problem, there has also been proposed a transistor having the following configuration. That is, a p-type doped gate is formed to enhance a potential barrier such that the transistor is of a normally-off type and can be applied with a high forward voltage. This transistor is referred to as a junction FET (JFET). Such JFET is described in L. Zhang et al., IEEE Transactions on Electron Devices, Vol. 47, No. 3, pp. 507-511, 2000 and Japanese Laid-Open Patent Application No. 2004-273486.

However, the JFET has a problem of a low switching speed due to holes accumulated in a channel region.

SUMMARY OF THE INVENTION

The object of the present invention is to provide a normally-off type transistor made of a nitride semiconductor, which can achieve a large-current operation and a high switching speed. In order to achieve the aforementioned object, the transistor of the present invention includes: a first nitride semiconductor layer which forms a channel region; a second nitride semiconductor layer which is formed on said first nitride semiconductor layer and has a band gap larger than a band gap of said first nitride semiconductor layer; a third nitride semiconductor layer which is formed on said second nitride semiconductor layer, has a p-type conductivity and includes a control region; a gate electrode which contacts with said control region; a source electrode and a drain electrode which are formed beside said control region; and a hole absorbing electrode which is connected to said first nitride semiconductor layer.

It is possible that the hole absorbing electrode is formed on an upper part of the first nitride semiconductor layer, and the first nitride semiconductor layer and the second nitride semiconductor layer include a p-type doped region of the hole absorbing electrode.

It is possible that a material of the hole absorbing electrode is diffused into the first nitride semiconductor layer.

It is possible that a part is removed from the second nitride semiconductor layer, and the hole absorbing electrode is formed in the removed part.

It is possible that the hole absorbing electrode is formed in the removed part, and the first nitride semiconductor layer which contacts with the hole absorbing electrode includes a p-type doped region of the hole absorbing electrode.

It is possible that the first nitride semiconductor layer includes a p-type fourth nitride semiconductor layer formed in parallel with top and bottom faces of the first nitride semiconductor layer, and the p-type doped region formed in the first nitride semiconductor layer contacts with the fourth nitride semiconductor layer.

It is possible that the fourth nitride semiconductor layer extends from a position under an edge of the gate electrode toward a position in the vicinity of below the source electrode, the position under the edge of the gate electrode being closer to the source electrode.

It is possible that the first nitride semiconductor layer includes a fifth nitride semiconductor layer which is formed immediately below the fourth nitride semiconductor layer and has a band gap larger than a band gap of the fourth nitride semiconductor layer.

Thus, the present invention provides a normally-off type transistor made of a nitride semiconductor which can achieve a large-current operation and a high switching speed.

FURTHER INFORMATION ABOUT TECHNICAL BACKGROUND TO THIS APPLICATION

The disclosure of Japanese Patent Application No. 2006-157776 filed on Jun. 6, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENTS

Prior to description of a best mode, the present invention is described in more detail.

Conventionally, in a normally-off type JFET, even when a forward bias is applied to a gate, a concentration of electrons to be previously generated in a channel is not so high. In addition, the forward bias can be applied to the gate until a current starts to flow from the gate, and is limited to at most 3 V.

In order to solve this problem, the present inventors have successfully achieved the following device structure. That is, a p-type $Al_{0.2}Ga_{0.8}N$ layer having a large band gap is formed on a channel made of a nitride semiconductor, and is forward biased with respect to the channel. Thus, holes are injected into the channel and electrons equal in amount to the holes are generated in the channel. As a result, it is possible to obtain a large operating current. With this device structure, it is possible to encourage the generation of the electrons in the channel by the injected holes, and to drastically increase a channel current. Herein, when the band gap of the p-type region which is larger than that of the channel is selected, an amount of the holes to be injected into the channel can be made larger than an amount of the electrons to be transferred from the channel to the p-type region. Thus, it is possible to effectively increase the carrier concentration in the channel. In the nitride semiconductor, a hole has mobility considerably lower than that of an electron; therefore, a hole injected into the channel hardly serves as a carrier for flowing an electric current. That is, in the channel, holes injected from the p-type region generate electrons equal in amount to the holes. As a result, it is possible to increase an operating current. As the mobility of the injected hole is approximate to zero, the hole serves as a donor ion. Thus, it is possible to modulate the carrier concentration in the channel. As a result, it is possible to realize a normally-off type nitride semiconductor device having a large operating current.

In such device, however, a large amount of holes are injected from a p-type AlGaN layer into a channel region when the device is in an ON state. Consequently, in the case where the device is switched from the ON state to an OFF state, since there is no place to discharge holes in the channel, it takes more time to switch to the OFF state. In other words, the device has a problem of a low switching speed.

The present invention addresses the aforementioned problem and aims to provide a method for enhancing such switching speed in a normally-off type nitride semiconductor device capable of achieving a large-current operation.

Hereinafter, a best mode for carrying out the present invention is described with reference to the drawings.

First Embodiment

Figure 1:
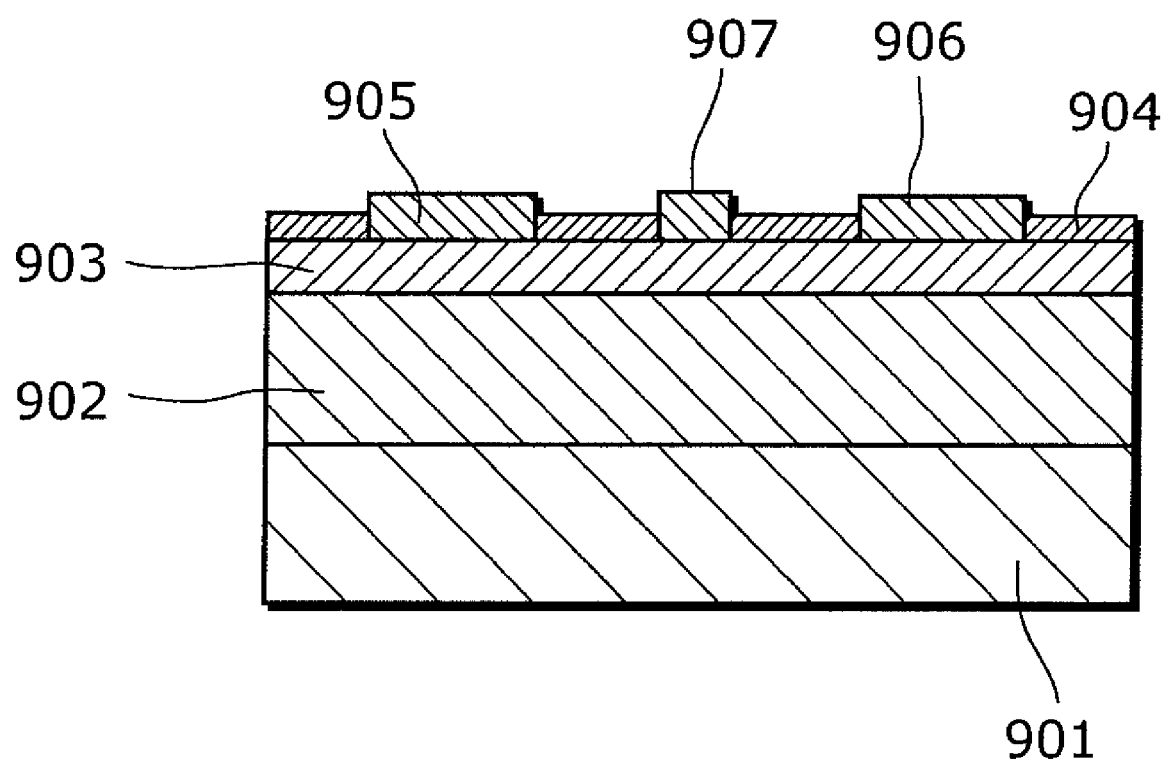
FIG. 1 shows a sectional view of a conventional FET having an AlGaN/GaN hetero junction.
Figure 2:
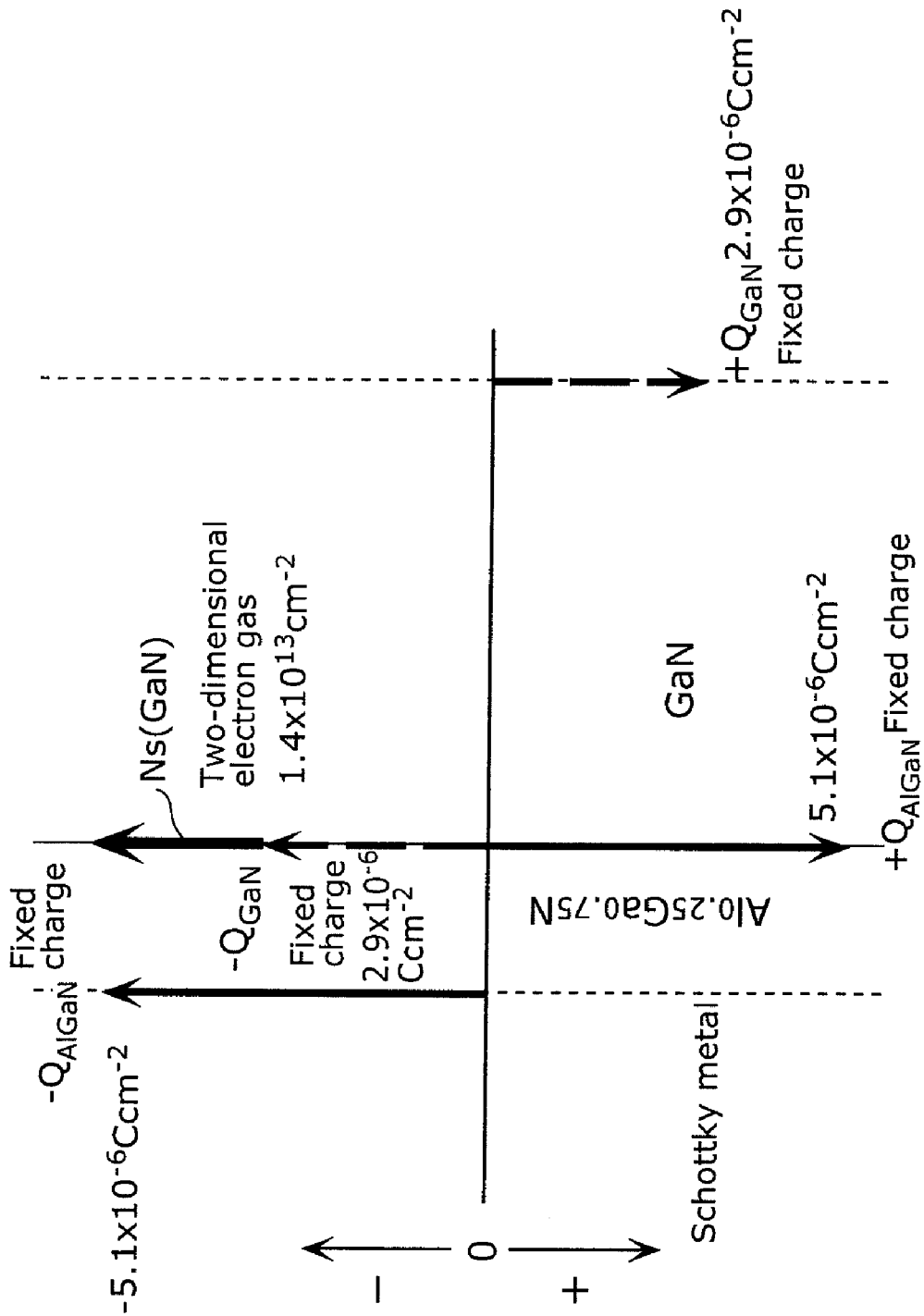
FIG. 2 shows distribution of fixed charges and free electrons induced by polarization in the conventional FET.
Figure 3:
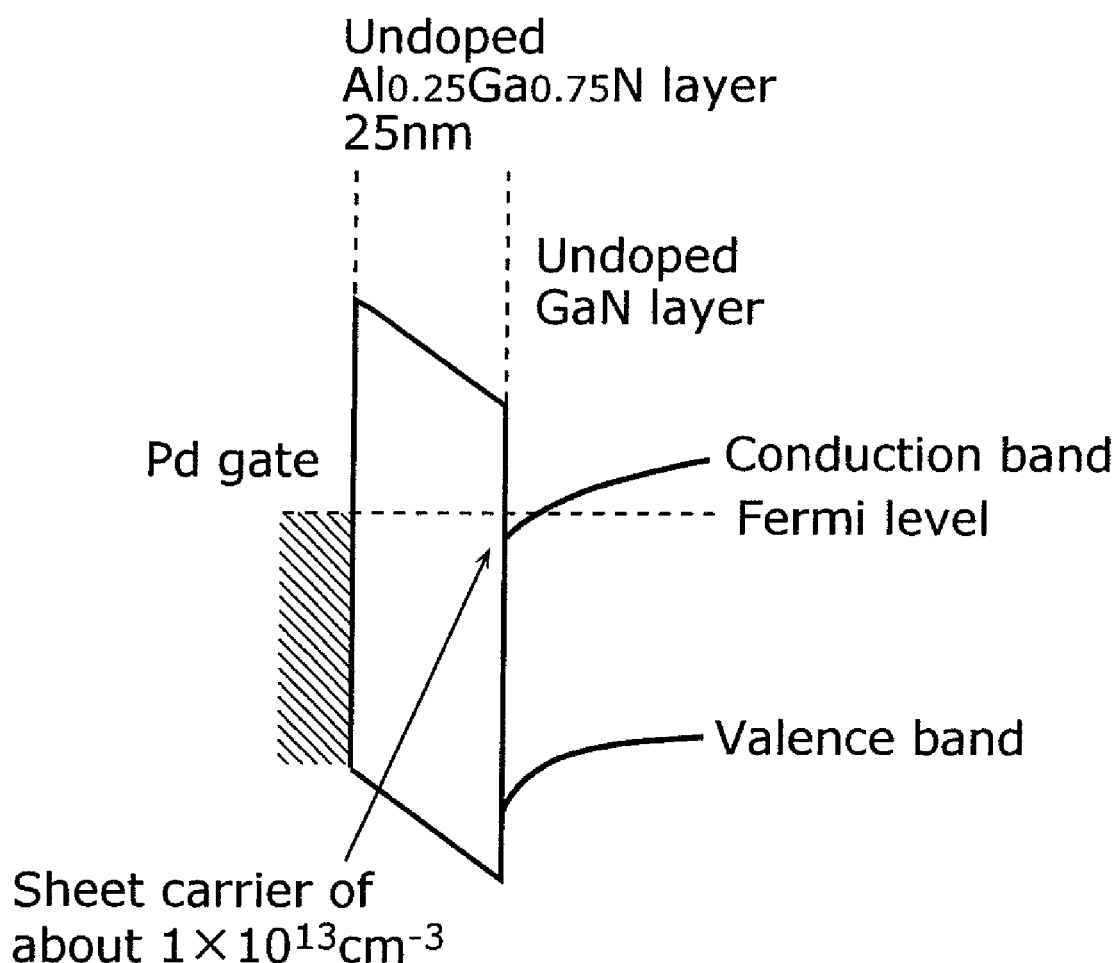
FIG. 3 shows an energy band diagram in the conventional FET.
Figure 4:
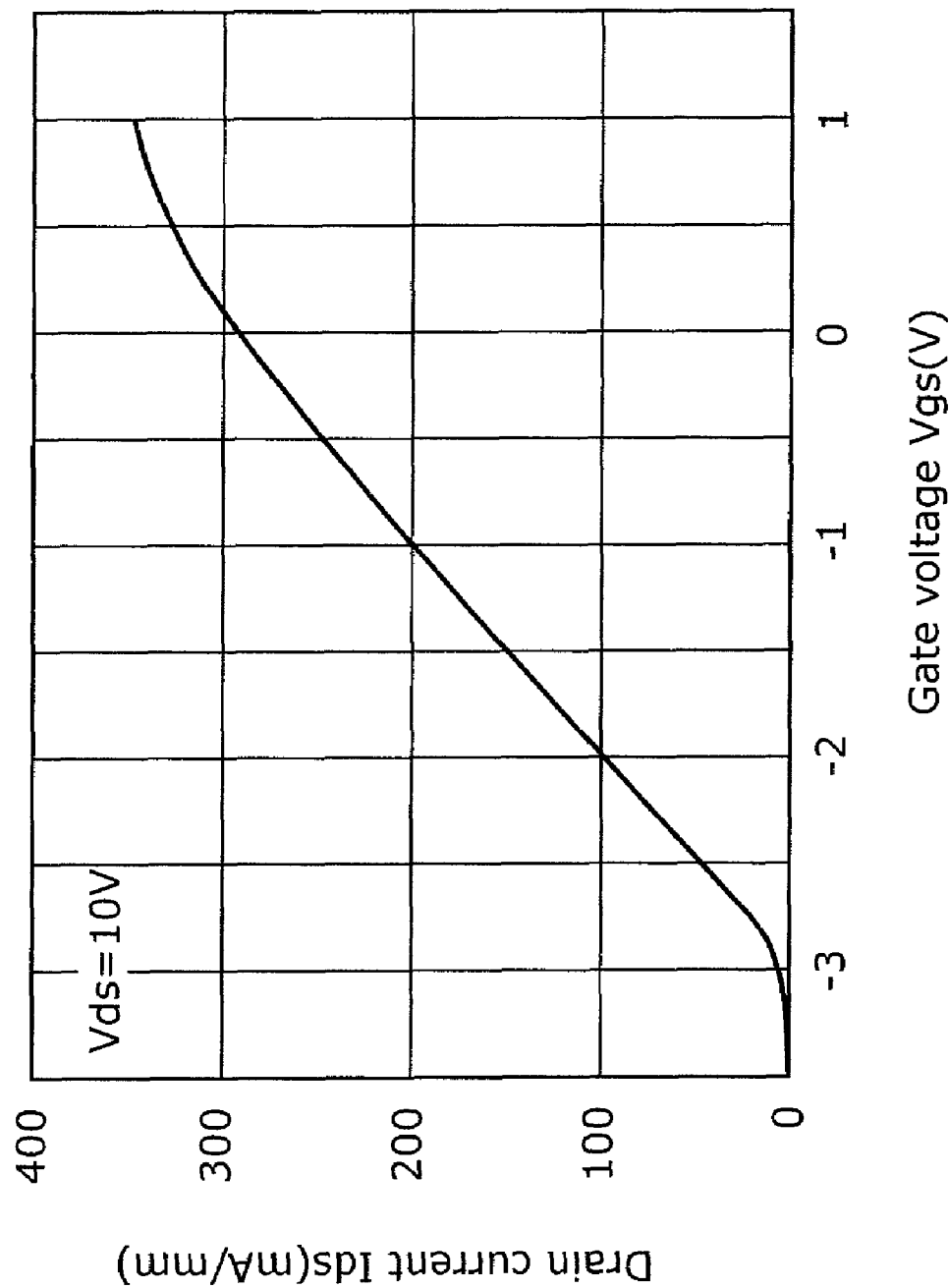
FIG. 4 shows a relation between a gate voltage and a drain current in the FET using two-dimensional electron gas as a carrier.
Figure 5:
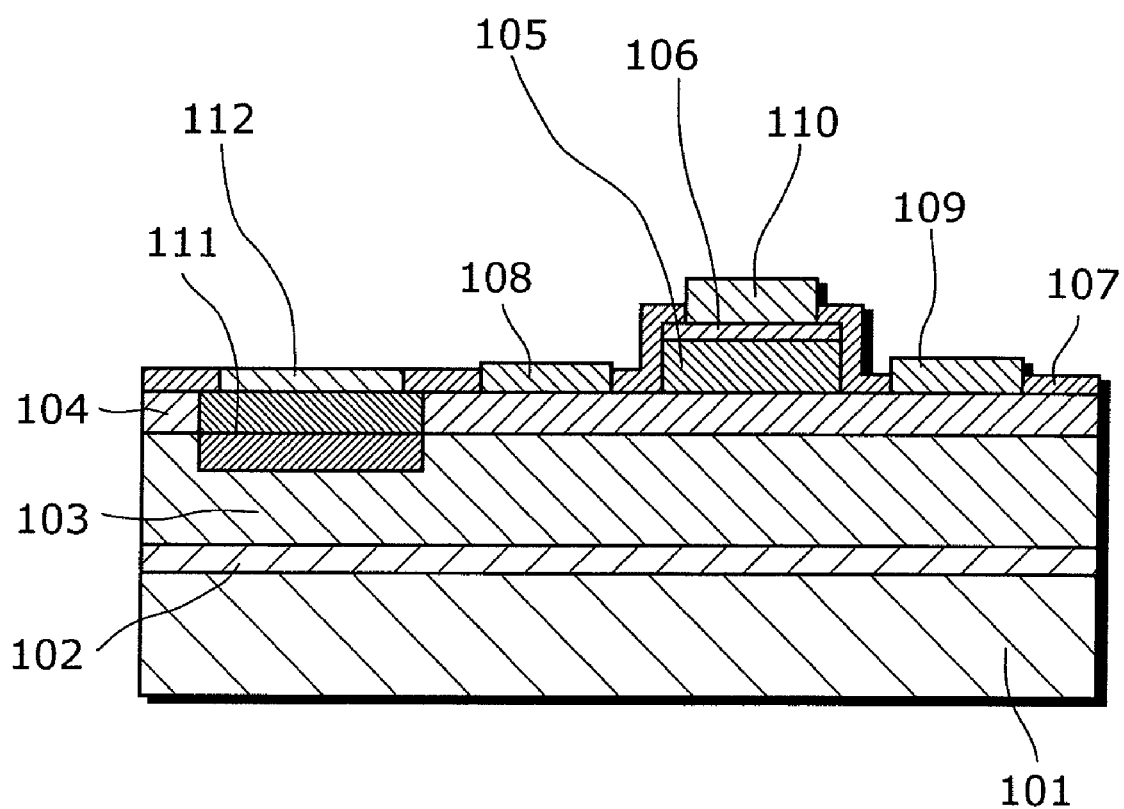
FIG. 5 shows a sectional view of a transistor according to a first embodiment of the present invention.

FIG. 5 shows a sectional view of a transistor according to a first embodiment of the present invention.

The transistor according to the first embodiment includes: a sapphire substrate 101 (e.g., 430 μm in thickness) which has a (0001) plane as a main plane; an AlN buffer layer 102 (e.g., 100 nm in thickness) which is formed on the (0001) plane of the sapphire substrate 101; an undoped GaN layer 103 (e.g., 2 μm in thickness) which is formed on the AlN buffer layer 102; an undoped $Al_{0.2}Ga_{0.8}N$ layer 104 (e.g., 20 nm in thickness) which is formed on the undoped GaN layer 103; a p-type $Al_{0.2}Ga_{0.8}N$ control layer (p-type control layer) 105 (e.g., 20 nm in thickness) which is formed on part of the undoped $Al_{0.2}Ga_{0.8}N$ layer 104 and contains p-type impurities; and a high-concentration p-type GaN contact layer (p-type contact layer) 106 (e.g., 20 nm in thickness) which is formed on the p-type control layer 105 and is made of GaN containing p-type impurities higher in concentration that those in the p-type control layer 105.

The AlN buffer layer 102, the undoped GaN layer 103, the undoped $Al_{0.2}Ga_{0.8}N$ layer 104, the p-type control layer 105 and the p-type contact layer 106 are formed sequentially on the (0001) plane of the sapphire substrate 101 by crystal growth.

The transistor according to the first embodiment also includes: an Ni gate electrode 110 which is formed on the p-type contact layer 106; and a Ti/Al source electrode 108 and a Ti/Al drain electrode 109 which are formed beside the Ni gate electrode 110. The Ni gate electrode 110 is made of Ni and is in ohmic contact with the p-type contact layer 106. The Ti/Al source electrode 108 and the Ti/Al drain electrode 109 are made of Ti and Al.

The undoped $Al_{0.2}Ga_{0.8}N$ layer 104 includes a p-type doped region 111. This p-type doped region 111 is located at a position opposite to the Ni gate electrode 110 with respect to the Ti/Al source electrode 108. The p-type doped region 111 is formed by, for example, Mg implantation and annealing. The transistor according to the first embodiment also includes an Ni ohmic electrode 112 which is formed on the p-type doped region 111. Herein, the Ni ohmic electrode 112 is located at a position opposite to the Ni gate electrode 110 with respect to the Ti/Al source electrode 108, on the undoped $Al_{0.2}Ga_{0.8}N$ layer 104. Herein, Ni as a material for the Ni ohmic electrode 112 may be diffused into the undoped GaN layer 103. The Ni ohmic electrode 112 serves as a hole absorbing electrode.

The transistor according to the first embodiment also includes a passivation film 107 which is made of SiN. The passivation film 107 is formed on the undoped $Al_{0.2}Ga_{0.8}N$ layer 104 so as not to cover the Ni gate electrode 110, the Ti/Al source electrode 108, the Ti/Al drain electrode 109 and the Ni ohmic electrode 112.

Figure 6:
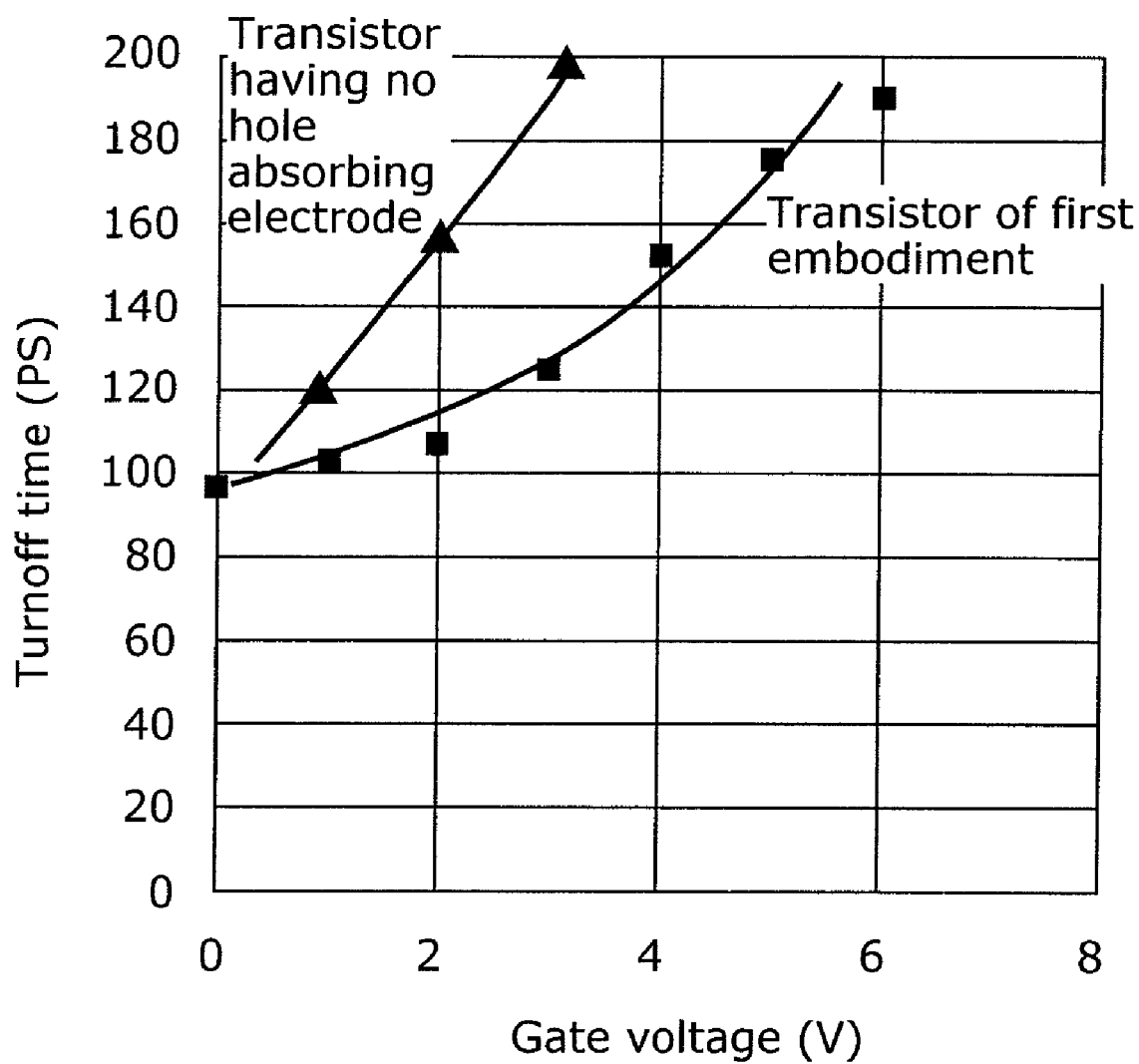
FIG. 6 shows a switching speed of a conventional normally-off type field effect transistor having no hole absorbing electrode and a switching speed of the transistor according to the first embodiment.

FIG. 6 shows a switching speed of a conventional normally-off type field effect transistor having no hole absorbing electrode (comparative transistor) and a switching speed of the transistor according to the first embodiment. The transistor according to the first embodiment has a structure that holes injected from the Ni gate electrode 110 and accumulated in the undoped GaN layer 103 are discharged from the transistor. The holes are absorbed in the Ni ohmic electrode (hole absorbing electrode) 112 and discharged to outside the transistor. The switching speed of the transistor according to the first embodiment is higher than that of the conventional transistor (comparative transistor) having a problem of holes accumulated in the undoped GaN layer 103. Particularly, this advantage, that is, the switching speed of the transistor according to the first embodiment is higher than that of the conventional transistor (comparative transistor), becomes conspicuous in the case where a gate voltage is equal to or more than 3 V.

With the transistor according to the first embodiment, as described above, the holes injected into the channel (undoped GaN layer 103) can be actively discharged from the transistor. Thus, it is possible to realize a normally-off type transistor capable of achieving a high-speed switching operation.

Herein, the sapphire (0001) substrate 101 may be replaced with a substrate made of, for example, SiC, GaN or Si. In addition, the plane direction of the sapphire substrate 101 is not particularly limited to the (0001) plane as long as the respective layers formed on the sapphire substrate 101 have preferable crystallinity.

Moreover, the Ni gate electrode 110 may be replaced with an electrode made of metal other than Ni, such as Pd, as long as a preferable ohmic contact with the p-type contact layer 106 is realized.

Further, the p-type $Al_{0.2}Ga_{0.8}N$ control layer 105 is not necessarily identical in Al composition to the undoped $Al_{0.2}Ga_{0.8}N$ layer 104. For example, the p-type control layer 105 may be made of p-type GaN.

Second Embodiment

Figure 7:
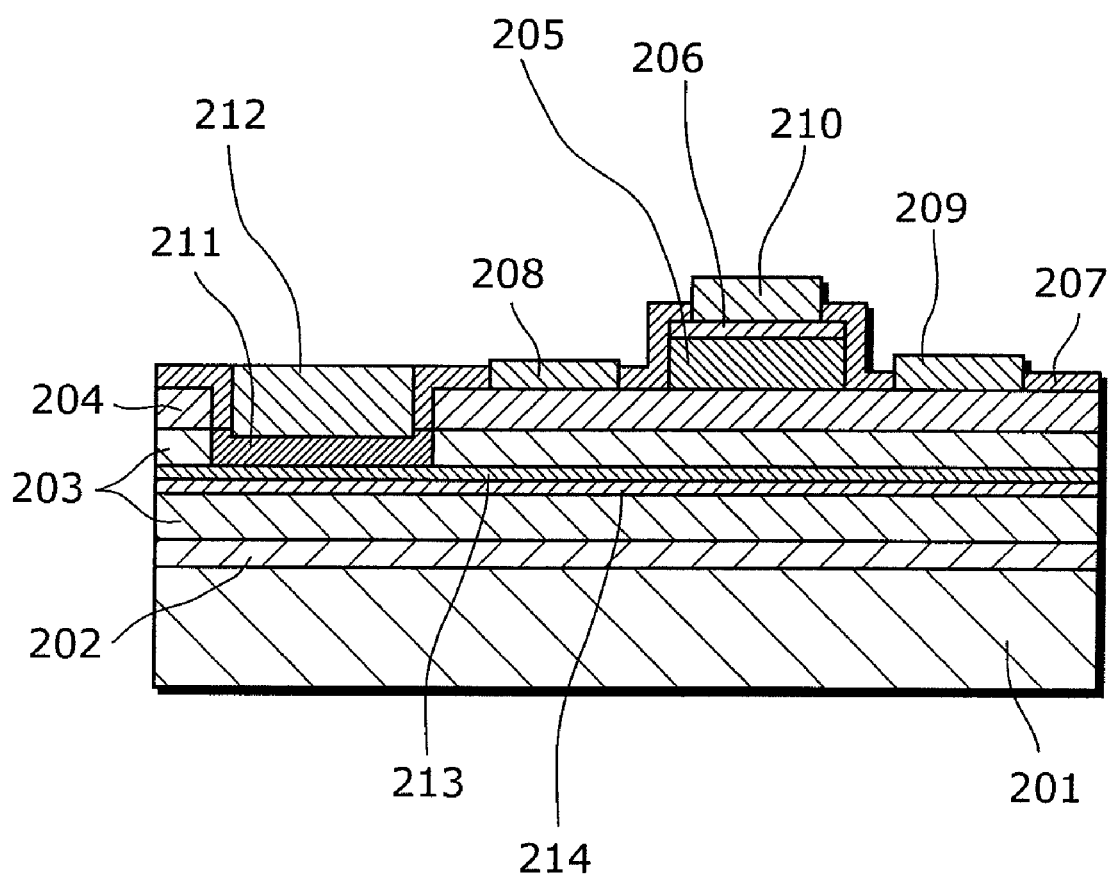
FIG. 7 shows a sectional view of a transistor according to a second embodiment of the present invention.

FIG. 7 shows a sectional view of a transistor according to a second embodiment of the present invention.

The transistor according to the second embodiment includes: a sapphire substrate 201 which has a (0001) plane as a main plane; an AlN buffer layer 202 which is formed on the (0001) plane of the sapphire substrate 201; an undoped GaN layer 203 which is formed on the AlN buffer layer 202; an undoped $Al_{0.2}Ga_{0.8}N$ layer 204 which is formed on the undoped GaN layer 203; a p-type $Al_{0.2}Ga_{0.8}N$ control layer (p-type control layer) 205 which is formed on part of the undoped $Al_{0.2}Ga_{0.8}N$ layer 204 and contains p-type impurities; and a high-concentration p-type GaN contact layer (p-type contact layer) 206 which is formed on the p-type control layer 205 and is made of GaN containing p-type impurities higher in concentration than those in the p-type control layer 205.

The AlN buffer layer 202, the undoped GaN layer 203, the undoped $Al_{0.2}Ga_{0.8}N$ layer 204, the p-type control layer 205 and the p-type contact layer 206 are formed sequentially on the (0001) plane of the sapphire substrate 201 by crystal growth.

The transistor according to the second embodiment also includes: an Ni gate electrode 210 which is formed on the p-type contact layer 206; and a Ti/Al source electrode 208 and a Ti/Al drain electrode 209 which are formed beside the Ni gate electrode 210. Herein, the Ni gate electrode 210 is located between the Ti/Al source electrode 208 and the Ti/Al drain electrode 209. The Ni gate electrode 210 is made of Ni and is in ohmic contact with the p-type contact layer 206. The Ti/Al source electrode 208 and the Ti/Al drain electrode 209 are made of Ti and Al.

The undoped $Al_{0.2}Ga_{0.8}N$ layer 204 is partially removed. In the undoped $Al_{0.2}Ga_{0.8}N$ layer 204, specifically, the removed region is located at a position opposite to the Ni gate electrode 210 with respect to the Ti/Al source electrode 208. The removed region may be referred to as a removed part. The undoped GaN layer 203 includes a p-type doped region 211, and this p-type doped region 211 is located below the removed region. The p-type doped region 211 in the undoped GaN layer 203 is formed by, for example, Mg implantation and annealing. The transistor according to the second embodiment also includes an Ni ohmic electrode 212 which is formed on the p-type doped region 211. The Ni ohmic electrode 212 is formed on the undoped GaN layer 203 and is located at the region from which the undoped $Al_{0.2}Ga_{0.8}N$ layer 204 is removed. Herein, Ni as a material for the Ni ohmic electrode 212 may be diffused into the undoped GaN layer 203.

The transistor according to the second embodiment also includes the Ni gate electrode 210, the Ti/Al source electrode 208, the Ti/Al drain electrode 209, and a passivation film 207, which are formed on the undoped $Al_{0.2}Ga_{0.8}N$ layer 204. For example, the Ni gate electrode 210 is located between the Ti/Al source electrode 208 and the Ti/Al drain electrode 209. The passivation film 207 is made of SiN and formed on the position so as not to cover the Ni ohmic electrode 212, the Ni gate electrode 210, the Ti/Al source electrode 208, and the Ti/Al drain electrode 209.

Figure 8:
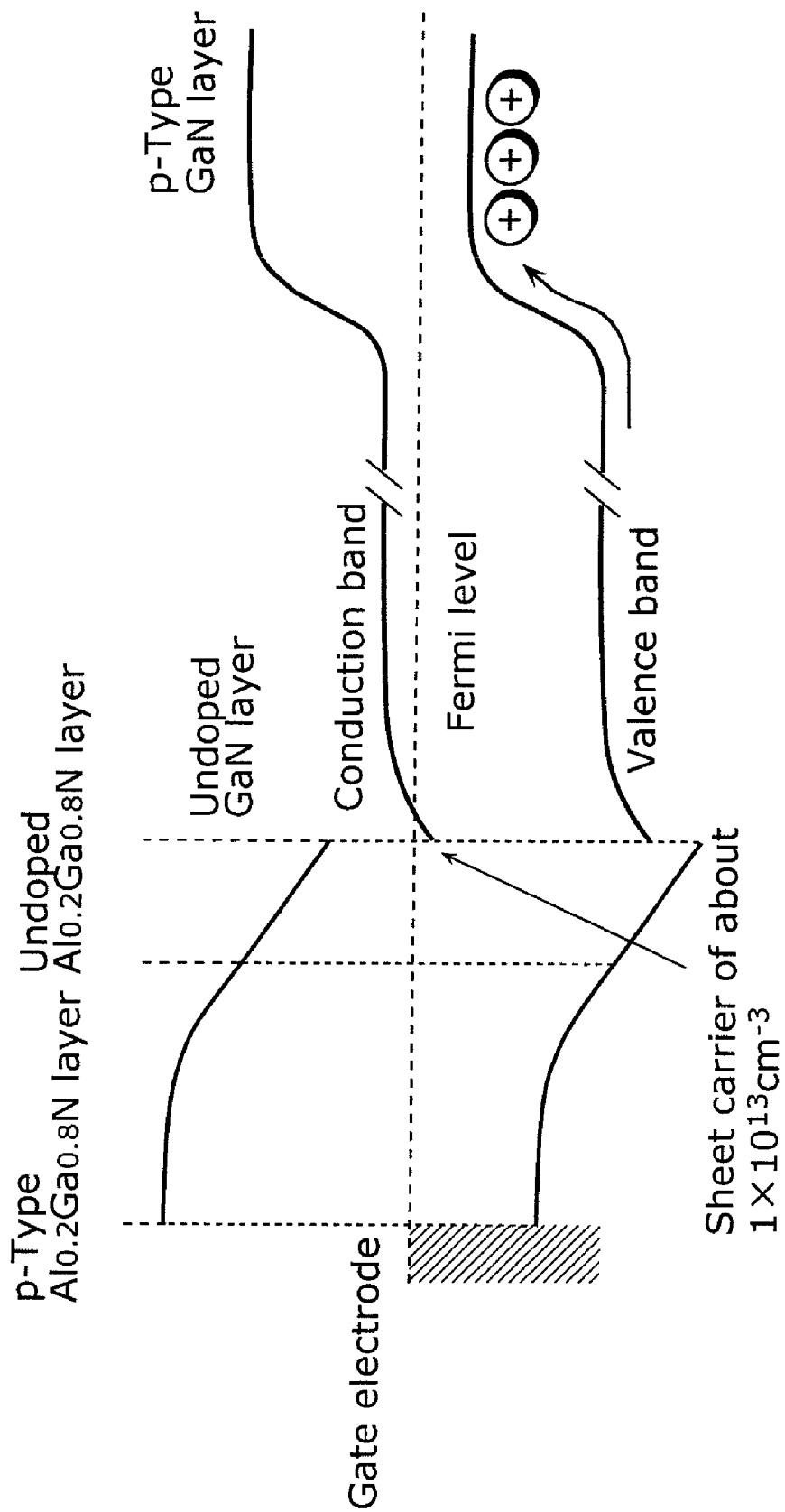
FIG. 8 shows an energy band diagram in the transistor according to the second embodiment.

In the undoped GaN layer 203, a p-type GaN layer 213 is formed in parallel with the sapphire substrate 201. The p-type doped region 211 in the undoped GaN layer 203 contacts with the p-type GaN layer 213. As shown in an energy band diagram of FIG. 8, the p-type GaN layer 213 can efficiently collect injected holes. As a result, it is possible to further improve a switching speed.

Also in the undoped GaN layer 203, an $Al_{0.2}Ga_{0.8}N$ layer 214 may be formed immediately below the p-type GaN layer 213. The $Al_{0.2}Ga_{0.8}N$ layer 214 serves as an energy barrier for holes; therefore, the holes can be effectively discharged from the transistor. As a result, it is possible to further improve a switching speed. In the $Al_{0.2}Ga_{0.8}N$ layer 214, a mixed crystal ratio of Al to Ga is not particularly limited to 0.2 as long as such layer 214 serves as a hole barrier.

Figure 9:
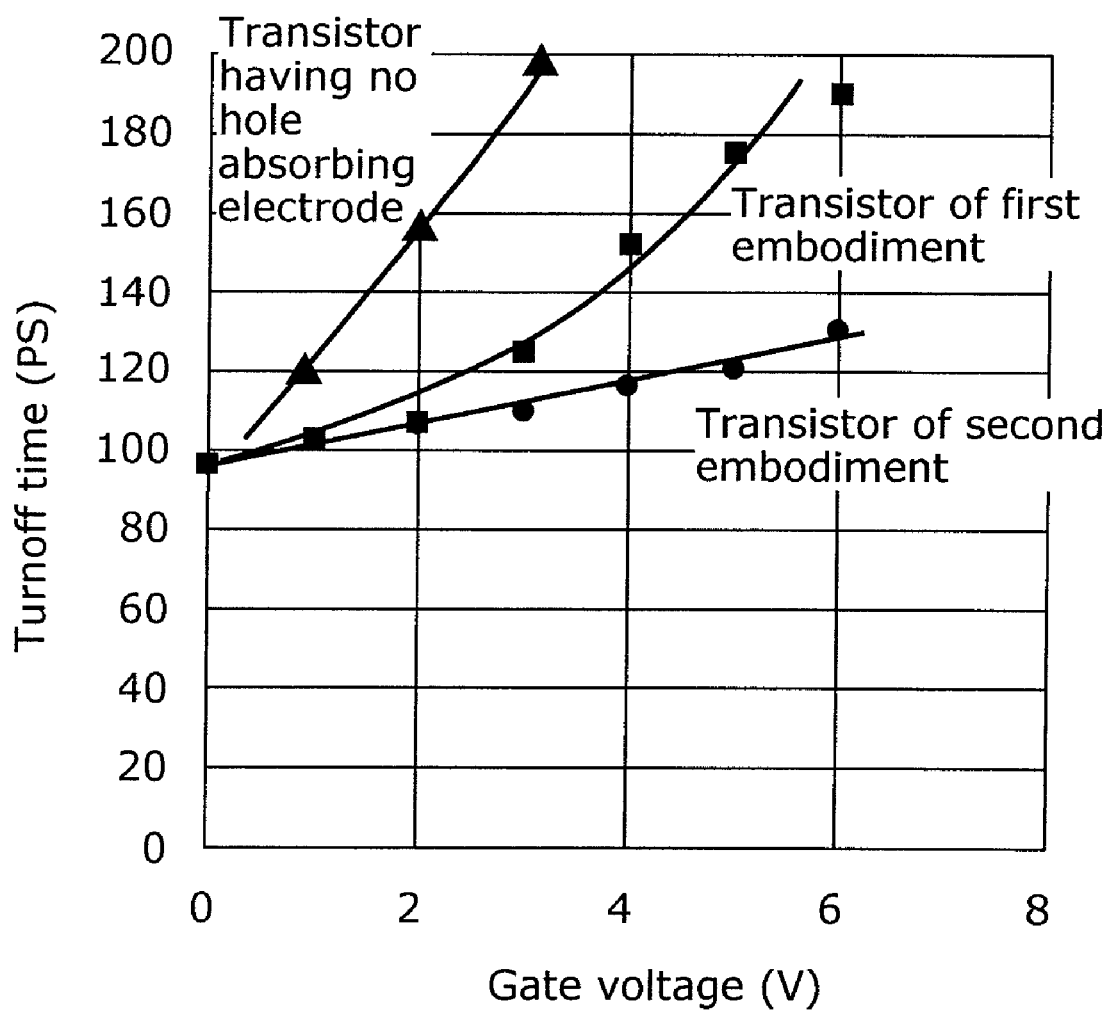
FIG. 9 shows the switching speed of the conventional normally-off type field effect transistor having no hole absorbing electrode and a switching speed of the transistor according to the second embodiment.

FIG. 9 shows the switching speed of the normally-off type field effect transistor having no hole absorbing electrode (comparative/conventional transistor) and a switching speed of the transistor according to the second embodiment. FIG. 9 also shows the switching speed of the transistor according to the first embodiment. The transistor according to the second embodiment has a structure that holes injected from the Ni gate electrode 210 and accumulated in the undoped GaN layer 203 are discharged from the transistor. Therefore, the switching speed of the transistor according to the second embodiment is higher than that of the conventional transistor (comparative transistor) having a problem of holes accumulated in the undoped GaN layer 203. Moreover, the switching speed of the transistor according to the second embodiment is higher than that of the transistor according to the first embodiment.

With the transistor according to the second embodiment, as described above, the holes injected into the channel (undoped GaN layer 203) can be actively discharged from the transistor. Thus, it is possible to realize a normally-off type transistor capable of achieving a high-speed switching operation.

Third Embodiment

Figure 10:
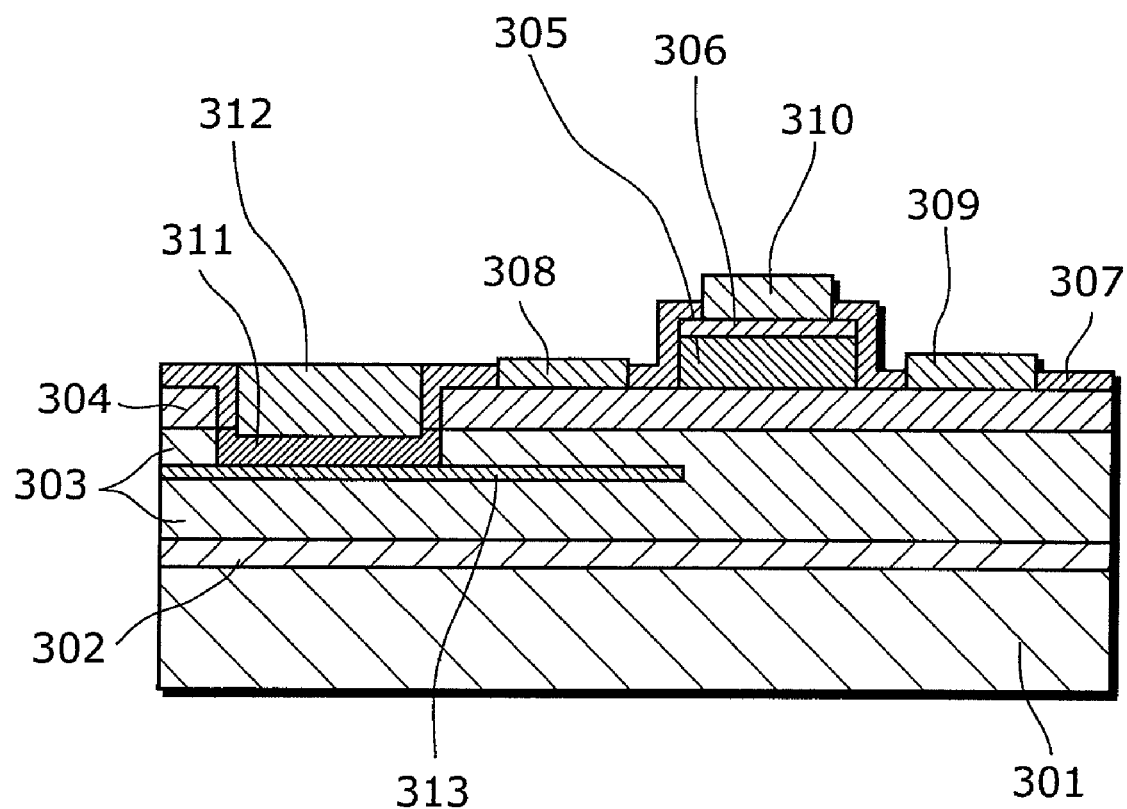
FIG. 10 shows a sectional view of a transistor according to a third embodiment of the present invention.

FIG. 10 shows a sectional view of a transistor according to a third embodiment of the present invention.

The transistor according to the third embodiment includes: a sapphire substrate 301 which has a (0001) plane as a main plane; an AlN buffer layer 302 which is formed on the (0001) plane of the sapphire substrate 301; an undoped GaN layer 303 which is formed on the AlN buffer layer 302; an undoped $Al_{0.2}Ga_{0.8}N$ layer 304 which is formed on the undoped GaN layer 303; a p-type $Al_{0.2}Ga_{0.8}N$ control layer (p-type control layer) 305 which is formed on part of the undoped $Al_{0.2}Ga_{0.8}N$ layer 304 and contains p-type impurities; and a high-concentration p-type GaN contact layer (p-type contact layer) 306 which is formed on the p-type control layer 305 and is made of GaN containing p-type impurities higher in concentration than those in the p-type control layer 305.

The AlN buffer layer 302, the undoped GaN layer 303, the undoped $Al_{0.2}Ga_{0.8}N$ layer 304, the p-type control layer 305 and the p-type contact layer 306 are formed sequentially on the (0001) plane of the sapphire substrate 301 by crystal growth.

The transistor according to the third embodiment also includes: an Ni gate electrode 310 which is formed on the p-type contact layer 306; and a Ti/Al source electrode 308 and a Ti/Al drain electrode 309 which are formed beside the Ni gate electrode 310. Herein, the Ni gate electrode 310 is located between the Ti/Al source electrode 308 and the Ti/Al drain electrode 309. The Ni gate electrode 310 is made of Ni and is in ohmic contact with the p-type contact layer 306. The Ti/Al source electrode 308 and the Ti/Al drain electrode 309 are made of Ti and Al.

The undoped $Al_{0.2}Ga_{0.8}N$ layer 304 is partially removed. In the undoped $Al_{0.2}Ga_{0.8}N$ layer 304, specifically, the removed region is located at a position opposite to the Ni gate electrode 310 with respect to the Ti/Al source electrode 308. The removed region may be referred to as a removed part. The undoped GaN layer 303 includes a p-type doped region 311, and this p-type doped region 311 is located below the removed region. The p-type doped region 311 in the undoped GaN layer 303 is formed by, for example, Mg implantation and annealing. The transistor according to the third embodiment also includes an Ni ohmic electrode 312 which is formed on the p-type doped region 311. The Ni ohmic electrode 312 is formed on the undoped GaN layer 303 and is located at the region from which the undoped $Al_{0.2}Ga_{0.8}N$ layer 304 is removed. Herein, Ni as a material for the Ni ohmic electrode 312 may be diffused into the undoped GaN layer 303.

The transistor according to the third embodiment also includes the Ni gate electrode 310, the Ti/Al source electrode 308, the Ti/Al drain electrode 309 and a passivation film 307, which are on the undoped $Al_{0.2}Ga_{0.8}N$ layer 304. The passivation film 307 is made of SiN, and formed so as not to cover the Ni gate electrode 310, the Ti/Al source electrode 308, the Ti/Al drain electrode 309 and the Ni ohmic electrode 312.

In the undoped GaN layer 303, a p-type GaN layer 313 is formed in parallel with the sapphire substrate 301. The p-type doped region 311 in the undoped GaN layer 303 contacts with the p-type GaN layer 313. In the undoped GaN layer 303, the p-type GaN layer 313 extends from a position immediately under an edge of the Ni gate electrode 310 which is closer to the the Ti/Al source electrode 308, toward a position where the Ti/Al source electrode 308 is located. With this configuration, discharging of holes at a drain is suppressed. Therefore, the transistor according to the third embodiment can be driven by a large electric current.

With the transistor according to the third embodiment, as described above, the holes injected into the channel (undoped GaN layer 303) can be actively discharged from the transistor. Thus, it is possible to realize a normally-off type transistor capable of achieving a high-speed switching operation and a large-current operation.

Fourth Embodiment

Figure 11:
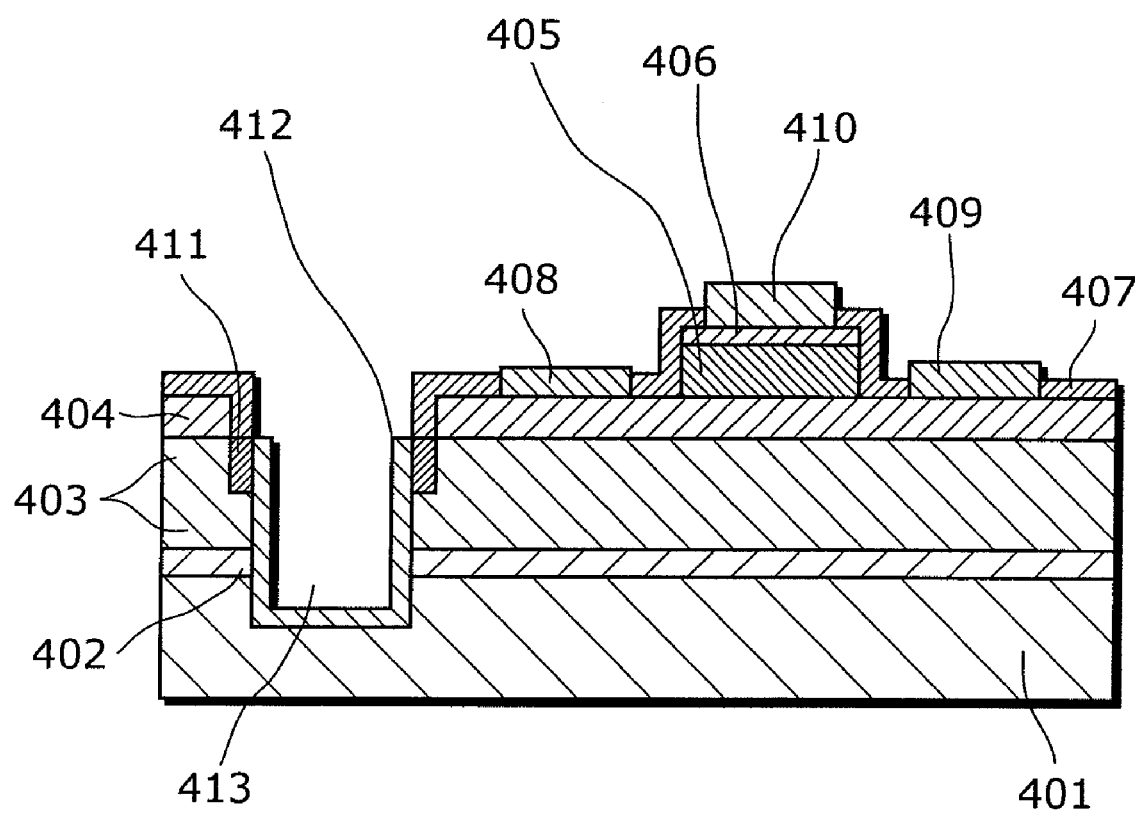
FIG. 11 shows a sectional view of a transistor according to a fourth embodiment of the present invention.

FIG. 11 shows a sectional view of a transistor according to a fourth embodiment of the present invention.

The transistor according to the fourth embodiment includes: an n-type silicon substrate 401 which has a (111) plane as a main plane; an AlN buffer layer 402 which is formed on the (111) plane of the silicon substrate 401; an undoped GaN layer 403 which is formed on the AlN buffer layer 402; an undoped $Al_{0.2}Ga_{0.8}N$ layer 404 which is formed on the undoped GaN layer 403; a p-type $Al_{0.2}Ga_{0.8}N$ control layer (p-type control layer) 405 which is formed on part of the undoped $Al_{0.2}Ga_{0.8}N$ layer 404 and contains p-type impurities; and a high-concentration p-type GaN contact layer (p-type contact layer) 406 which is formed on the p-type control layer 405 and is made of GaN containing p-type impurities higher in concentration than those in the p-type control layer 405.

The AlN buffer layer 402, the undoped GaN layer 403, the undoped $Al_{0.2}Ga_{0.8}N$ layer 404, the p-type control layer 405 and the p-type contact layer 406 are formed sequentially on the (111) plane of the silicon substrate 401 by crystal growth.

The transistor according to the fourth embodiment also includes: an Ni gate electrode 410 which is formed on the p-type contact layer 406; and a Ti/Al source electrode 408 and a Ti/Al drain electrode 409 which are formed beside the Ni gate electrode 410. Herein, the Ni gate electrode 410 is located between the Ti/Al source electrode 408 and the Ti/Al drain electrode 409. The Ni gate electrode 410 is made of Ni and is in ohmic contact with the p-type contact layer 406. The Ti/Al source electrode 408 and the Ti/Al drain electrode 409 are made of Ti and Al.

The undoped GaN layer 403 and the undoped $Al_{0.2}Ga_{0.8}N$ layer 404 are partially removed to form a concave part 413. In the undoped GaN layer 403 and the undoped $Al_{0.2}Ga_{0.8}N$ layer 404, specifically, the concave part 413 is located at a position opposite to the Ni gate electrode 410 with respect to the Ti/Al source electrode 408. The concave part 413 reaches part of the silicon substrate 401. The undoped GaN layer 403 includes a p-type doped region 411, and this p-type doped region 411 is located at a position contacting with the concave part 413 and is closer to the surface of the undoped $Al_{0.2}Ga_{0.8}N$ layer 404. The p-type doped region 411 in the undoped GaN layer 403 is formed by, for example, Mg implantation and annealing.

The transistor according to the fourth embodiment also includes an Ni ohmic electrode 412 which is in ohmic contact with the p-type doped region 411 and is formed on a surface of the concave part 413. With this configuration, a wide region on the surface of the concave part 413 serves as a hole absorbing electrode. As a result, it is possible to achieve a high-speed switching operation.

With the transistor according to the fourth embodiment, as described above, holes injected into the channel (undoped GaN layer 403) can be actively discharged from the transistor. Thus, it is possible to realize a normally-off type transistor capable of achieving a high-speed switching operation.

Fifth Embodiment

Figure 12:
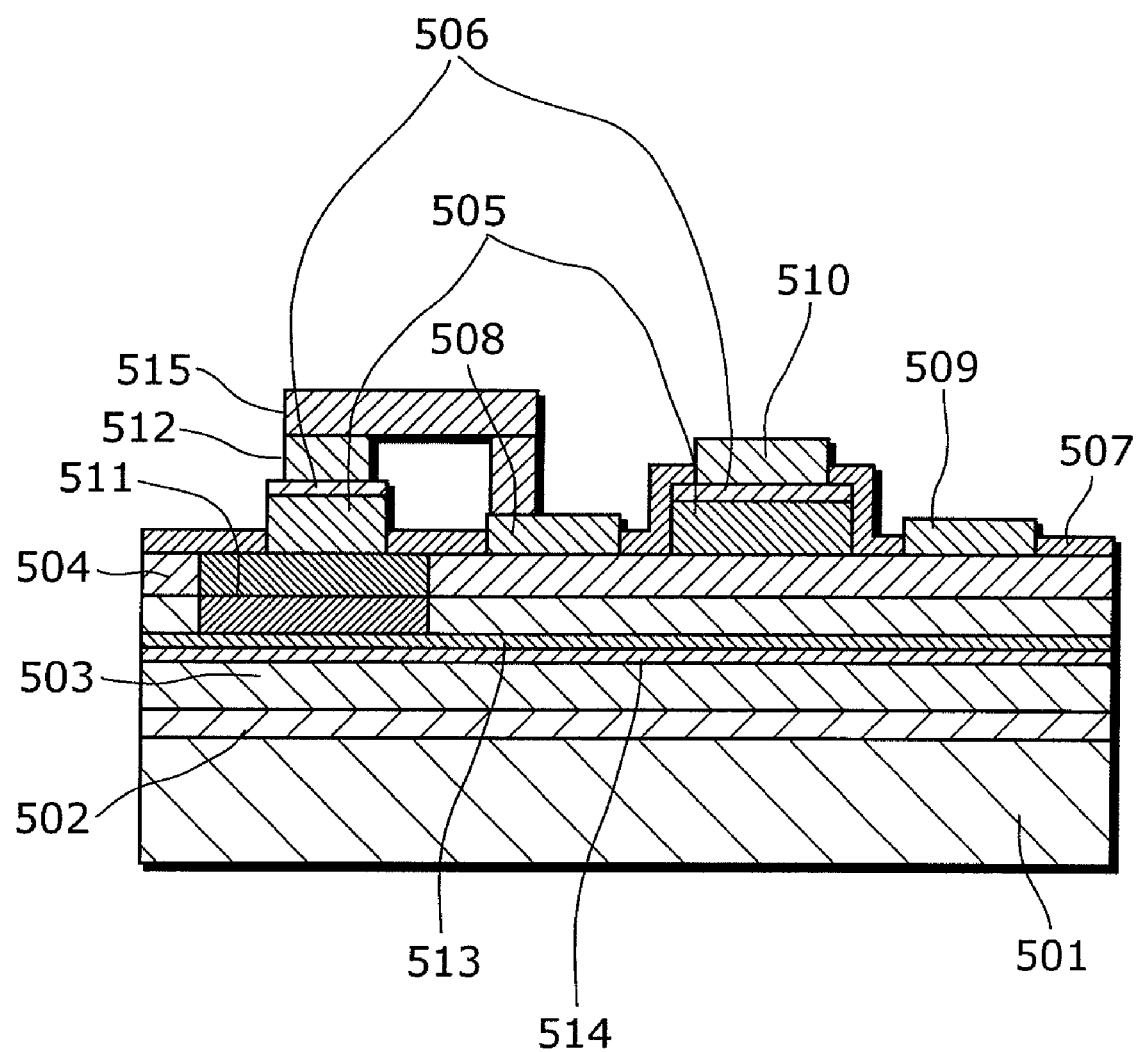
FIG. 12 shows a sectional view of a transistor according to a fifth embodiment of the present invention.

FIG. 12 shows a sectional view of a transistor according to a fifth embodiment of the present invention.

The transistor according to the fifth embodiment includes: a sapphire substrate 501 which has a (0001) plane as a main plane; an AlN buffer layer 502 which is formed on the (0001) plane of the sapphire substrate 501; an undoped GaN layer 503 which is formed on the AlN buffer layer 502; an undoped $Al_{0.2}Ga_{0.8}N$ layer 504 which is formed on the undoped GaN layer 503; a p-type $Al_{0.2}Ga_{0.8}N$ control layer (p-type control layer) 505 which is formed on part of the undoped $Al_{0.2}Ga_{0.8}N$ layer 504 and contains p-type impurities; and a high-concentration p-type GaN contact layer (p-type contact layer) 506 which is formed on the p-type control layer 505 and is made of GaN containing p-type impurities higher in concentration than those in the p-type control layer 505.

The AlN buffer layer 502, the undoped GaN layer 503, the undoped $Al_{0.2}Ga_{0.8}N$ layer 504, the p-type control layer 505 and the p-type contact layer 506 are formed sequentially on the (0001) plane of the sapphire substrate 501 by crystal growth.

The transistor according to the fifth embodiment also includes: an Ni gate electrode 510 which is formed on the p-type contact layer 506 (which is referred to as a first p-type contact layer 506); and a Ti/Al source electrode 508 and a Ti/Al drain electrode 509 which are formed beside the Ni gate electrode 510. Herein, the Ni gate electrode 510 is located between the Ti/Al source electrode 508 and the Ti/Al drain electrode 509, and the p-type control layer 505 is referred to as a first p-type contact layer 505. The Ni gate electrode 510 is made of Ni and is in ohmic contact with the first p-type contact layer 506. The Ti/Al source electrode 508 and the Ti/Al drain electrode 509 are made of Ti and Al.

The undoped $Al_{0.2}Ga_{0.8}N$ layer 504 includes a p-type doped region 511. The p-type doped region 511 is located at a position opposite to the Ni gate electrode 510 with respect to the Ti/Al source electrode 508. The p-type doped region 511 is formed by, for example, Mg implantation and annealing.

The transistor according to the fifth embodiment also includes: a second p-type control layer 505 which is located at a position different from that of the aforementioned first p-type control layer 505 and is formed on the p-type doped region 511; and a second p-type contact layer 506 which is located at a position different from the aforementioned first p-type contact layer 506 and is formed on the second p-type control layer 505. The second p-type contact layer 506 is located at a position opposite to the Ni gate electrode 510 with respect to the Ti/Al source electrode 508, and is above the undoped $Al_{0.2}Ga_{0.8}N$ layer 504.

The transistor according to the fifth embodiment also includes an Ni ohmic electrode 512 which is formed on the second p-type contact layer 506 and is in ohmic contact with the second p-type contact layer 506. Herein, Ni as a material for the Ni ohmic electrode 512 may be diffused into the undoped GaN layer 503. The p-type doped region 511 contacts with the p-type GaN layer 513 in the undoped GaN layer 503. As shown in an energy band diagram of FIG. 8, the p-type GaN layer 513 formed in the undoped GaN layer 503 can efficiently collect injected holes. As a result, it is possible to further improve a switching speed. An $Al_{0.2}Ga_{0.8}N$ layer 514 may be formed immediately below the p-type GaN layer 513. The $Al_{0.2}Ga_{0.8}N$ layer 514 serves as an energy barrier for holes; therefore, the holes can be efficiently discharged from the transistor. As a result, it is possible to further improve a switching speed.

In the $Al_{0.2}Ga_{0.8}N$ layer 514, a mixed crystal ratio of Al to Ga is not particularly limited to 0.2 as long as such layer 514 serves as a hole barrier.

The p-type doped region 511 does not necessarily contact with the p-type GaN layer 513 in the undoped GaN layer 503. Preferably, the p-type doped region 511 contacts with the p-type GaN layer 513 in terms of improvement in switching speed.

The Ni ohmic electrode 512 for discharging holes is electrically connected to the source electrode 508 through a wiring 515. Thus, the Ni ohmic electrode 512 for discharging holes has a potential equal to that of the source electrode 508. Therefore, the holes are efficiently absorbed in the hole absorbing electrode and discharged to outside the transistor by an electric field. As a result, it is possible to achieve a high-speed switching operation.

The transistor according to the fifth embodiment also includes the Ni gate electrode 510, the Ti/Al source electrode 508, the Ti/Al drain electrode 509, and a passivation film 507, which are formed on the the undoped $Al_{0.2}Ga_{0.8}N$ layer 504. The passivation film 507 is made of SiN, and formed so as not to cover the Ni gate electrode 510, the Ti/Al source electrode 508, the Ti/Al drain electrode 509, and the Ni ohmic electrode 512.

With the transistor according to the fifth embodiment, as described above, the holes injected into the channel (undoped GaN layer 503) can be actively discharged from the transistor. Thus, it is possible to realize a normally-off type transistor capable of achieving a high-speed switching operation. Further, the gate electrode and the hole absorbing electrode are made of an identical material and, therefore, can be formed concurrently. As a result, it is possible to prepare the transistor according to the fifth embodiment by a considerably simple process.

Accordingly, the transistor according to the present invention is useful as a high withstand voltage power transistor or the like.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A transistor comprising:
   a first nitride semiconductor layer which forms a channel region;
   a second nitride semiconductor layer which is formed on said first nitride semiconductor layer and has a band gap larger than a band gap of said first nitride semiconductor layer;
   a third nitride semiconductor layer which is formed on said second nitride semiconductor layer, has a p-type conductivity and includes a control region;
   a gate electrode which contacts said control region;
   a source electrode and a drain electrode which are formed beside said control region; and
   a hole absorbing electrode which is connected to said first nitride semiconductor layer,
   wherein said hole absorbing electrode is formed on an upper part of said second nitride semiconductor layer, and
   said first nitride semiconductor layer and said second nitride semiconductor layer include a p-type doped region below said hole absorbing electrode.

2. A transistor comprising:
   a first nitride semiconductor layer which forms a channel region;
   a second nitride semiconductor layer which is formed on said first nitride semiconductor layer and has a band gap larger than a band gap of said first nitride semiconductor layer;
   a third nitride semiconductor layer which is formed on said second nitride semiconductor layer, has a p-type conductivity and includes a control region;
   a gate electrode which contacts said control region;
   a source electrode and a drain electrode which are formed beside said control region; and
   a hole absorbing electrode which is connected to said first nitride semiconductor layer,
   wherein a material of said hole absorbing electrode is diffused into said first nitride semiconductor layer.

3. The transistor according to claim 1,
   wherein a material of said hole absorbing electrode is diffused into said first nitride semiconductor layer.

4. A transistor comprising:
   a first nitride semiconductor layer which forms a channel region;
   a second nitride semiconductor layer which is formed on said first nitride semiconductor layer and has a band gap larger than a band gap of said first nitride semiconductor layer;
   a third nitride semiconductor layer which is formed on said second nitride semiconductor layer, has a p-type conductivity and includes a control region;
   a gate electrode which contacts said control region;
   a source electrode and a drain electrode which are formed beside said control region; and
   a hole absorbing electrode which is connected to said first nitride semiconductor layer,
   wherein a part is removed from said second nitride semiconductor layer,
   said hole absorbing electrode is formed in the removed part, and
   said first nitride semiconductor layer which contacts said hole absorbing electrode includes a p-type doped region below said hole absorbing electrode.

5. A transistor comprising:
   a first nitride semiconductor layer which forms a channel region;
   a second nitride semiconductor layer which is formed on said first nitride semiconductor layer and has a band gap larger than a band gap of said first nitride semiconductor layer;
   a third nitride semiconductor layer which is formed on said second nitride semiconductor layer, has a p-type conductivity and includes a control region;
   a gate electrode which contacts said control region;
   a source electrode and a drain electrode which are formed beside said control region; and
   a hole absorbing electrode which is connected to said first nitride semiconductor layer,
   wherein a part is removed from said second nitride semiconductor layer,
   said hole absorbing electrode is formed in the removed part, and
   a material of said hole absorbing electrode is diffused into said first nitride semiconductor layer.

6. The transistor according to claim 4,
   wherein a material of said hole absorbing electrode is diffused into said first nitride semiconductor layer.

7. The transistor according to claim 4,
   wherein said first nitride semiconductor layer includes a p-type fourth nitride semiconductor layer formed in parallel with top and bottom faces of said first nitride semiconductor layer, and
   the p-type doped region formed in said first nitride semiconductor layer contacts said fourth nitride semiconductor layer.

8. The transistor according to claim 7,
   wherein said fourth nitride semiconductor layer extends from a position under an edge of said gate electrode toward a position in the vicinity of below said source electrode, the position under the edge of said gate electrode being closer to said source electrode.

9. The transistor according to claim 7,
   wherein said first nitride semiconductor layer includes a fifth nitride semiconductor layer which is formed immediately below said fourth nitride semiconductor layer and has a band gap larger than a band gap of said fourth nitride semiconductor layer.

10. The transistor according to claim 8,
wherein said first nitride semiconductor layer includes a fifth nitride semiconductor layer which is formed immediately below said fourth nitride semiconductor layer and has a band gap larger than a band gap of said fourth nitride semiconductor layer.

11. A transistor comprising:
a first nitride semiconductor layer which forms a channel region;
a second nitride semiconductor layer which is formed on said first nitride semiconductor layer and has a band gap larger than a band gap of said first nitride semiconductor layer;
a third nitride semiconductor layer which is formed on said second nitride semiconductor layer, has a p-type conductivity and includes a control region;
a gate electrode which contacts with said control region;
a source electrode and a drain electrode which are formed beside said control region;
a hole absorbing electrode which is connected to said first nitride semiconductor layer; and
a conductive substrate,
wherein said first nitride semiconductor layer is formed on said substrate,
said first nitride semiconductor layer includes a first through part,
said second nitride semiconductor layer includes a second through part which is continuous to said first through part,
said substrate includes a concave part which is continuous to said first through part and said second through part,
said hole absorbing electrode is continuously formed on a surface of said concave part, a surface of said first through part of said first nitride semiconductor layer and a surface of said second through part of said second nitride semiconductor layer, and
said first nitride semiconductor layer includes a p-typed doped region which is in ohmic contact with said hole absorbing electrode.

12. A transistor comprising:
a first nitride semiconductor layer which forms a channel region;
a second nitride semiconductor layer which is formed on said first nitride semiconductor layer and has a band gap larger than a band gap of said first nitride semiconductor layer;
a third nitride semiconductor layer which is formed on said second nitride semiconductor layer, has a p-type conductivity and includes a control region;
a gate electrode which contacts with said control region;
a source electrode and a drain electrode which are formed beside said control region;
a hole absorbing electrode which is connected to said first nitride semiconductor layer; and
a fourth nitride semiconductor layer which is formed on said second nitride semiconductor layer and has a p-type conductivity,
wherein said hole absorbing electrode is formed on said fourth nitride semiconductor layer.

13. The transistor according to claim 1, wherein said hole absorbing electrode is in ohmic contact with said p-type doped region.

14. The transistor according to claim 4, wherein said hole absorbing electrode is in ohmic contact with said p-type doped region.

* * * * *